US009252150B1

(12) United States Patent  
Shih et al.

(10) Patent No.: US 9,252,150 B1  
(45) Date of Patent: Feb. 2, 2016

(54) HIGH ENDURANCE NON-VOLATILE MEMORY CELL

(71) Applicant: Taiwan Semiconductor Manufacturing Co., Ltd., Hsin-Chu (TW)

(72) Inventors: Hung-Ling Shih, Tainan (TW); Yong-Shiuan Tsair, Tainan (TW); Tsun-Kai Tsao, Tainan (TW); Po-Wei Liu, Tainan (TW); Wen-Tuo Huang, Tainan (TW); Yu-Ling Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/445,697

(22) Filed: Jul. 29, 2014

(51) Int. Cl.  
*H01L 21/8247* (2006.01)  
*H01L 27/115* (2006.01)  
*H01L 29/423* (2006.01)  
*H01L 29/06* (2006.01)  
*H01L 29/49* (2006.01)  
*H01L 29/51* (2006.01)  
*H01L 21/027* (2006.01)  
*H01L 21/28* (2006.01)  
*H01L 21/762* (2006.01)  
*H01L 21/321* (2006.01)

(52) U.S. Cl.  
CPC ...... *H01L 27/11521* (2013.01); *H01L 21/0276* (2013.01); *H01L 21/28273* (2013.01); *H01L 21/32115* (2013.01); *H01L 21/76224* (2013.01); *H01L 29/0649* (2013.01); *H01L 29/42324* (2013.01); *H01L 29/4916* (2013.01); *H01L 29/513* (2013.01); *H01L 29/518* (2013.01)

(58) Field of Classification Search  
CPC .................. H01L 27/11521; H01L 21/32115; H01L 21/0276; H01L 29/4916; H01L 29/42324; H01L 29/513; H01L 21/28273; H01L 29/0649; H01L 29/518; H01L 21/76224  
See application file for complete search history.

(56) References Cited

U.S. PATENT DOCUMENTS

| | | |
|---|---|---|
| 4,794,565 A | 12/1988 | Wu et al. |
| 6,103,573 A | 8/2000 | Harari et al. |
| 6,140,182 A | 10/2000 | Chen |
| 6,747,310 B2 | 6/2004 | Fan et al. |
| 7,075,140 B2 | 7/2006 | Spadea |
| 7,358,134 B2 | 4/2008 | Wu et al. |
| 7,710,763 B2 | 5/2010 | Houston |
| 7,718,488 B2 | 5/2010 | Chen et al. |
| 7,906,805 B2 | 3/2011 | Sadd et al. |
| 8,384,147 B2 | 2/2013 | Do et al. |
| 2005/0064666 A1* | 3/2005 | Kim ............... H01L 21/28273 438/286 |
| 2005/0281125 A1 | 12/2005 | Chung |
| 2006/0145192 A1 | 7/2006 | Van Duuren et al. |
| 2007/0122753 A1* | 5/2007 | Jang .................... G03F 7/40 430/316 |
| 2007/0158737 A1 | 7/2007 | Yang et al. |
| 2007/0218632 A1 | 9/2007 | Chung |
| 2007/0257299 A1 | 11/2007 | Chen et al. |
| 2009/0039410 A1 | 2/2009 | Liu et al. |

\* cited by examiner

*Primary Examiner* — Richard Booth  
(74) *Attorney, Agent, or Firm* — Eschweiler & Associates, LLC

(57) ABSTRACT

The present disclosure relates to a non-volatile memory cell structure, and an associated method. A non-volatile memory cell includes two transistors spaced apart from one another with floating gates connected together by a floating gate bridge. During the operation, the non-volatile memory cell is programmed and erased from one first transistor and read from the other second transistor. Since the floating gates of the two transistors are connected together and insulated from other ambient layers, stored charges can be controlled from the first transistor and affect a threshold of the second transistor.

20 Claims, 13 Drawing Sheets

HIGH ENDURANCE NON-VOLATILE MEMORY CELL

BACKGROUND

Flash memory is an electronic non-volatile computer storage medium that can be electrically erased and reprogrammed. To store information, flash memory includes an addressable array of memory cells; each of which includes a transistor with a floating gate disposed over a substrate separated therefrom by an insulating dielectric layer. When written to and erased during the normal course of use, defects disposed in the insulating dielectric layer may trap charges and unavoidably degrade the insulating effect. Other types of damage may also reduce the effectiveness of the insulating dielectric layer, reducing ability of the floating gate to hold a charge for an extended period of time. Each flash memory can sustain a finite amount of degradation before it becomes unreliable, meaning it may still function but not consistently. The number of writes operations performed (e.g., program and erase cycles) a flash memory can sustain while still maintaining a consistent, predictable output, defines its endurance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
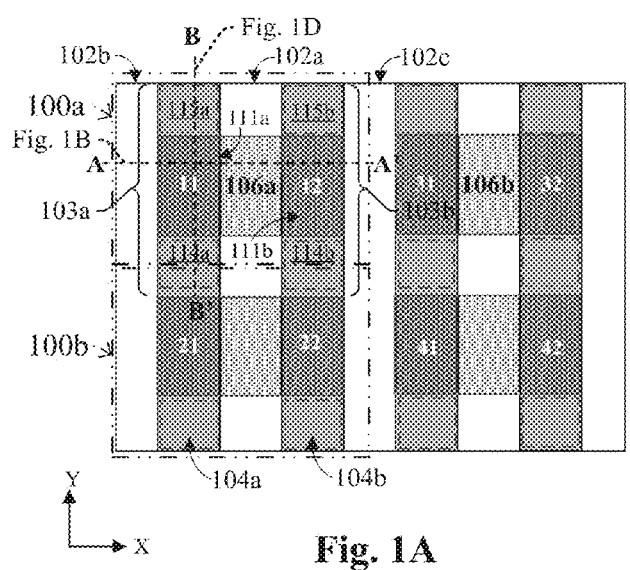
FIG. 1A illustrates a top view of some embodiments of a non-volatile memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A non-volatile memory cell includes a transistor with a floating gate disposed above a channel, which is arranged between source/drain regions of the transistor. The floating gate is insulated by a thin insulation film so that the floating gate can store charge (electrons) for a relatively long time (e.g. years) regardless of power being on or off. The charge stored in the floating gate controls a threshold of the transistor depending on how much charge is stored in the floating gate. One approach to write a first data state (e.g., a so-called "program operation") for the non-volatile memory cell is to inject electrons into the floating gate by applying a high current from a source region of the transistor to the floating gate (known as source side injection, SSI, which sets the voltage threshold value of the transistor to a first value. Conversely, to write a second data state (e.g., a so-called "erase operation") for the non-volatile memory cell, a high voltage can be applied to the floating gate to promote electrons leaving the floating gate by tunneling (known as Fowler-Nordheim tunneling, FN tunneling).

During programming and erasing, some of the electrons traveling in and out the floating gate may become permanently trapped in the insulation film disposed between the floating gate and the channel. Other types of damages, such as hot carrier effects, can also damage the insulation film. Over time, these trapped charge and/or other types of damage can cause the Vt distributions of the memory cells to shift from their target values, or can reduce the speed at which memory read or write operations can take place. Thus, the reliability and/or performance of the memory cell is degraded.

In order to improve the endurance of a floating gate memory cell, the present disclosure sets forth a non-volatile memory cell structure and manufacturing methods therefor. Referring to FIGS. 1A-1D concurrently, non-limiting example structures of a non-volatile memory cell 100 are disclosed. The non-volatile memory cell 100a includes a first transistor 103a and a second transistor 103b spaced apart from one another but have their corresponding floating gates 11 and 12 connected together.

During operation, the non-volatile memory cell 100a is programmed and erased from the first transistor 103a and read from the second transistor 103b. Since the floating gates 11 and 12 of the two transistors are connected together and insulated from other ambient layers, stored charge can be controlled from the first transistor 103a and affect a threshold of the second transistor 103b. A gate dielectric layer of reading transistor—the second transistor 103b disposed between the floating gate 12 and the channel 111b is saved from degrading introduced by high voltage, high current, and charge movement during programming and erasing. Also, since the programming and erasing operations are separated from the reading operation, speed of the non-volatile memory can be improved and disturbance can be reduced.

In many embodiments of the present disclosure, the non-volatile memory cell 100a is formed by a manufacturing procedure including a slit etch followed by a planarization process. The non-volatile memory cell 100a can be fabricated by forming a plurality of isolation regions 102 higher than a top surface of a semiconductor substrate first and then forming transistors within active regions 104 self-aligned by the isolation regions 102. The connection component, a floating gate bridge 106a electrically connecting the floating gates 11 and 12 can be formed by covering a portion of a conductive material directly above a central isolation region 102a from being removed when etching the conductive material directly above peripheral isolation regions 102b and 102c.

Figure 1C:
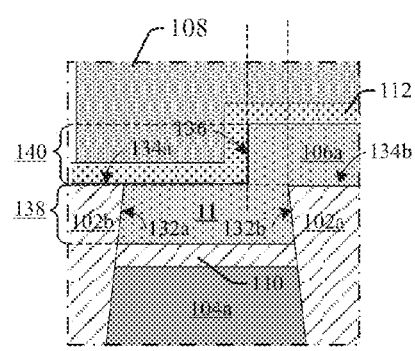
FIG. 1C illustrates an enlarged regional view of FIG. 1B.
Figure 1B:
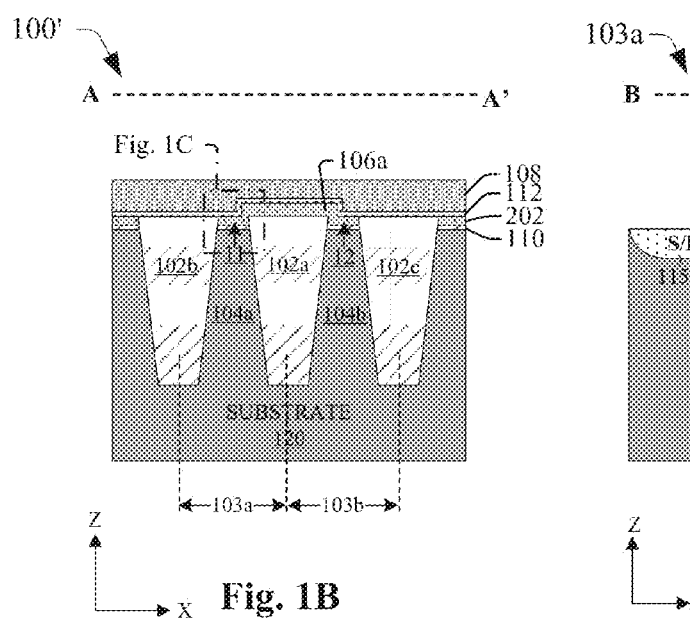
FIG. 1B illustrates a cross-sectional view of some embodiments of the non-volatile memory cell of FIG. 1A along line A-A'.
Figure 1D:
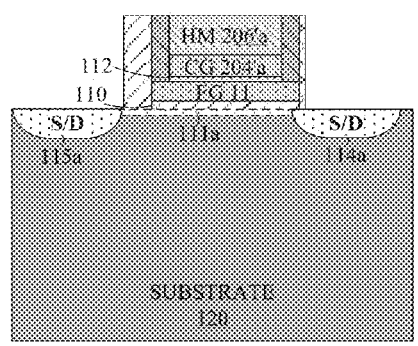
FIG. 1D illustrates a cross-sectional view of some embodiments of the non-volatile memory cell of FIG. 1A along line B-B'.

FIG. 1B shows an example cross-sectional view of the non-volatile memory cell 100a of FIG. 1A along line A-A'. As mentioned above, the isolation regions 102 can be disposed higher than a top surface of the substrate 120 to form recesses between the isolation regions 102. The floating gates 11 and 12 are self-aligned and well-defined by sidewalls of the isolation regions 102. Notably, since the floating gate bridge 106a is kept while a portion of a first conductive layer 202 directly above the peripheral isolation regions 102b and 102c is removed by a slit etch, the central isolation region 102a is extended and continuous along the y direction between the active regions 104a and 104b compared to previous approaches. There are no additional margin rules for the central isolation region 102a to be introduced compared to a case without the floating gate bridge (e.g. a non-volatile memory cell with single transistor). The size of the non-volatile memory cell is minimized.

In greater detail, FIG. 1A shows a 2×2 memory cell array disposed over a semiconductor substrate in a first direction x and a second direction y as a non-limiting example for easy illustration. The first direction x and the second direction y may be perpendicular to each other. Each memory cell 100a, 100b, etc., may have a similar structure as the memory cell 100. FIG. 1B shows a cross-sectional view of some embodiments of the non-volatile memory cell 100 of FIG. 1A along line A-A' in the x direction. The non-volatile memory cell 100 comprises a first active region 104a and a second active region 104b. The first and second active regions 104a and 104b have a first conductivity type, such as p type or n type. Along a first direction x, the first active region 104a and the second active region 104b are separated by a central isolation region 102a. The central isolation region 102a central isolation region 102a is disposed between innermost sides of the first active region 104a and the second active region 104b. A first peripheral isolation region 102b is arranged about an outermost side of the first active region 104a; and a second peripheral isolation region 102c is arranged about an outermost side of the second active region 104b. The central isolation region 102a and the first and second peripheral isolation regions 102b and 102c are disposed higher than the first and second active regions 104a and 104b; forming a first recess between the central isolation region 102a and the first peripheral isolation region 102b, and a second recess between the central isolation region 102a and the second peripheral isolation region 102c. In some embodiments, the isolation regions are shallow trenches filled with an insulating material. A conductive material is filled into the first and second recesses to form a first floating gate 11 of a first transistor and a second floating gate 12 of a second transistor. A first dielectric layer 110 is respectively formed between the first and second floating gates 11 and 12 and the first and second active regions 104a and 104b as a gate dielectric. A floating gate bridge 106a is disposed above the central isolation region 102a; connecting the first floating gate 11 and the second floating gate 12. The floating gate bridge 106a can be made of same material with the first and second floating gates 11 and 12. The first and second floating gates 11 and 12 are disposed in the first and second recesses so that the first floating gate 11 abuts a left sidewall of the central isolation region 102a and a first sidewall of the first peripheral isolation region 102b. Symmetrically, the second floating gate 12 abuts a right sidewall of the central isolation region 102a and a second sidewall of the first peripheral isolation region 102b.

FIG. 1C shows an enlarged regional view of a portion of FIG. 1B marked by dash-dotted rectangular of some embodiments of the non-volatile memory cell 100. FIG. 1C shows some embodiments of relative positions of the first floating gate 11, the floating gate bridge 106a, the central isolation region 102a, the first peripheral isolation region 102b, and the first active region 104a. In the embodiments, the first floating gate 11 is disposed abutting the first sidewall 132a of the first peripheral isolation region 102b and the left sidewall 132b of the central isolation region 102a central isolation region 102a. The first height 138 from the active region 104a to a top surface 134a of the first peripheral isolation region 102b is in a range of from about 100 Å to about 1000 Å. In some embodiments, the first height 138 is around 350 Å. The gate dielectric 110 is disposed between the first floating gate 11 and the first active region 104a. A second dielectric layer 112 is disposed on the first floating gate 11 and the floating gate bridge 106a under a control gate layer 108. The floating gate bridge 106 is disposed above the central isolation region 102a with a second height from a top surface 134b of the central isolation region 102a central isolation region 102a. In some embodiments, the second height is about 350 Å. The floating gate bridge 106 laterally extends over an edge of the central isolation region 102a along the x direction.

Referring back to FIG. 1A, the non-volatile memory cell 100 comprises a first transistor corresponding to the first floating gate 11 is disposed at the first active region 104a and a second transistor corresponding to the second floating gate 12 is disposed at the second active region 104b. The first transistor comprises a first drain region 115a and a first source region 114a spaced apart by a first channel region 111a in the y direction. A first control gate is capacitively coupled to the first floating gate 11. The second transistor comprise a second drain region 115b and a second source region 114b spaced apart by a second channel region 111b in the y direction. A second control gate is capacitively coupled to the second floating gate 12. The non-volatile memory cell 100 is read from one of the transistors, for example the first transistor, and programmed and erased from the other transistor, for example the second transistor. As an example, the non-volatile memory cell 100 can be read by applying a first bias to the first drain region 115a; while non-volatile memory cell 100 can be programmed by applying a second bias to the second floating gate 12 and be erased by injecting hot electrons from the second source region 114b. In some embodiments, the first source region 114a and the second source region 114b are electrically connected together in the substrate 120.

Figure 2A:
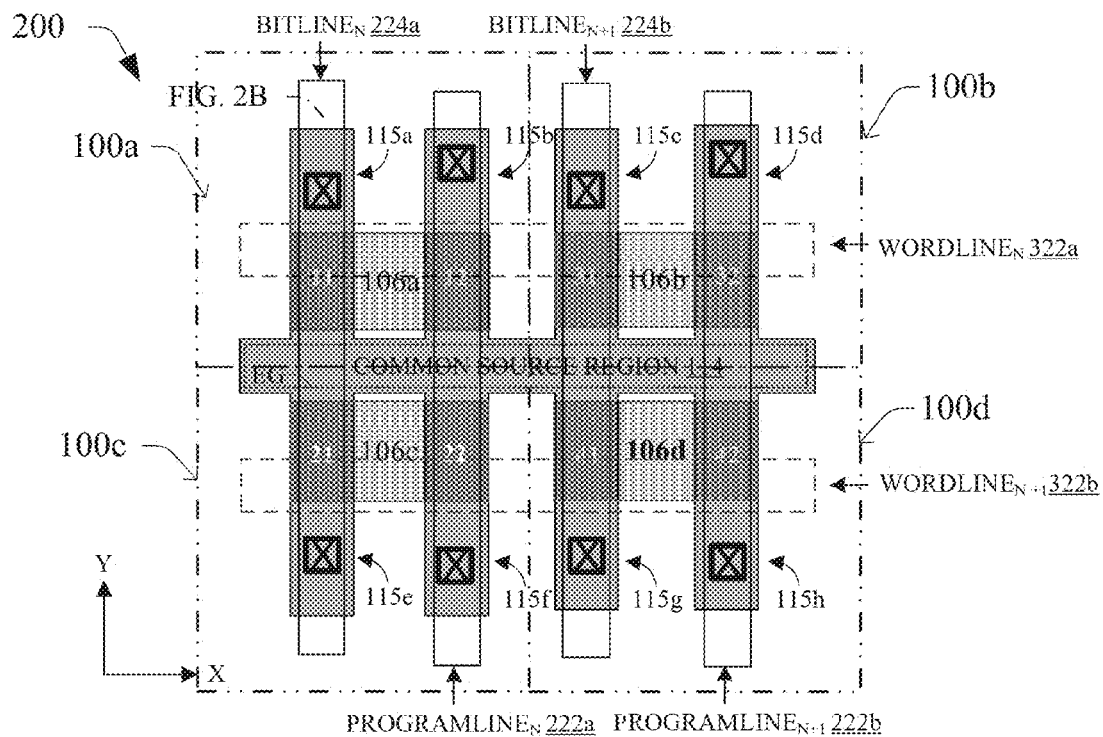
FIG. 2A illustrates a top view of some embodiments of a non-volatile memory.

In some embodiments, the first drain region 115a of the first transistor can be connected with the first transistors of other memory cells by a bit line. The second drain region 115b of the second transistor can be connected with the second transistors of other memory cells by a programming line. FIG. 2A shows an example top view of some embodiments of a non-volatile memory 200 with a plurality of non-volatile memory cells 100. For illustrative purposes, the non-volatile memory 200 includes 2 columns in the y direction and 2 rows in the x direction of non-volatile memory cell 100, but it is to be understood that more or less columns and/or more or less rows are amenable. In FIG. 2A's example, a plurality of word lines extend in the x direction, each word line connecting control gates of the memory cells along a given row. For example, a first word line 322a connects the control gates in a row n, and a second word line 322b connects the control gates in a row n+1. A plurality of bit lines are extended in the y direction, each bit line connecting drain region of the first transistor of the memory cells in a given column. For example, a first bit line 224a connects the drain regions of the first transistors in a column n, i.e. 115a and 115e, and a second bit line 224b connects the drain regions of the first transistor in a column n+1, i.e. 115c and 115g. A plurality of program lines are extended in the y direction, each program line connecting drain region of the second transistor of the memory cells in a given column. For example, a first program line 222a connects the drain regions of the second transistors in a column n, i.e. 115b and 115f, and a second program line 222b connects the drain regions of the second transistor in a column n+1, i.e. 115d and 115h. The plurality of non-volatile memory cells 100 shares a common source region 114.

Figure 2B:
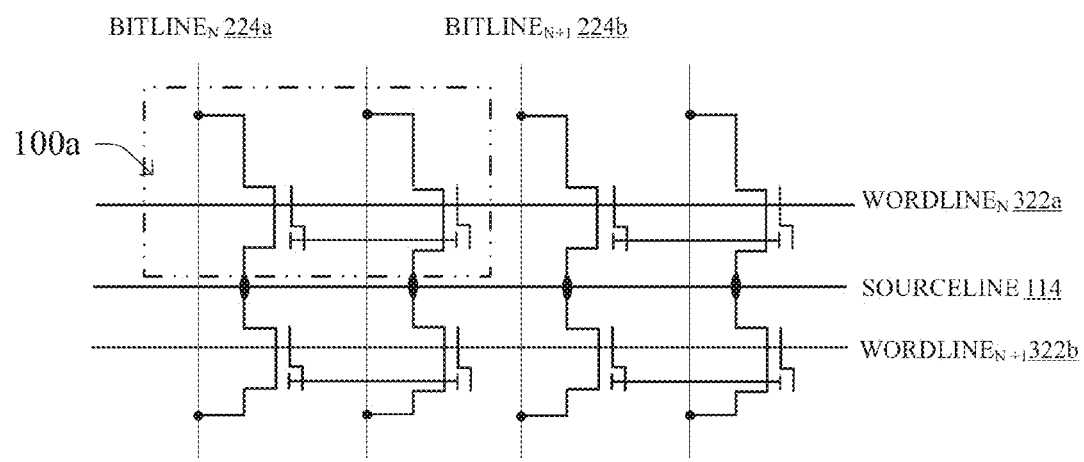
FIG. 2B illustrates an equivalent circuit of some embodiments of the non-volatile memory of FIG. 2A.

FIG. 2B shows an equivalent circuit of some embodiments of the non-volatile memory 200 of FIG. 2A. FIG. 2 shows as a "NOR" memory cell structure wherein a pair of the memory cells (e.g. 100a and 100c) are connected in parallel sharing a common source and having drain regions connected together within a bit line. In some other embodiments, the memory cells 100 can be connected in series, wherein a drain region of one memory cell is shared as a source region of another memory cell; and multiple memory cells within a bit line can be connected in this way. This structure is known as "NAND" memory structure. Other applicable memory cell structures are also amenable.

Figure 3:
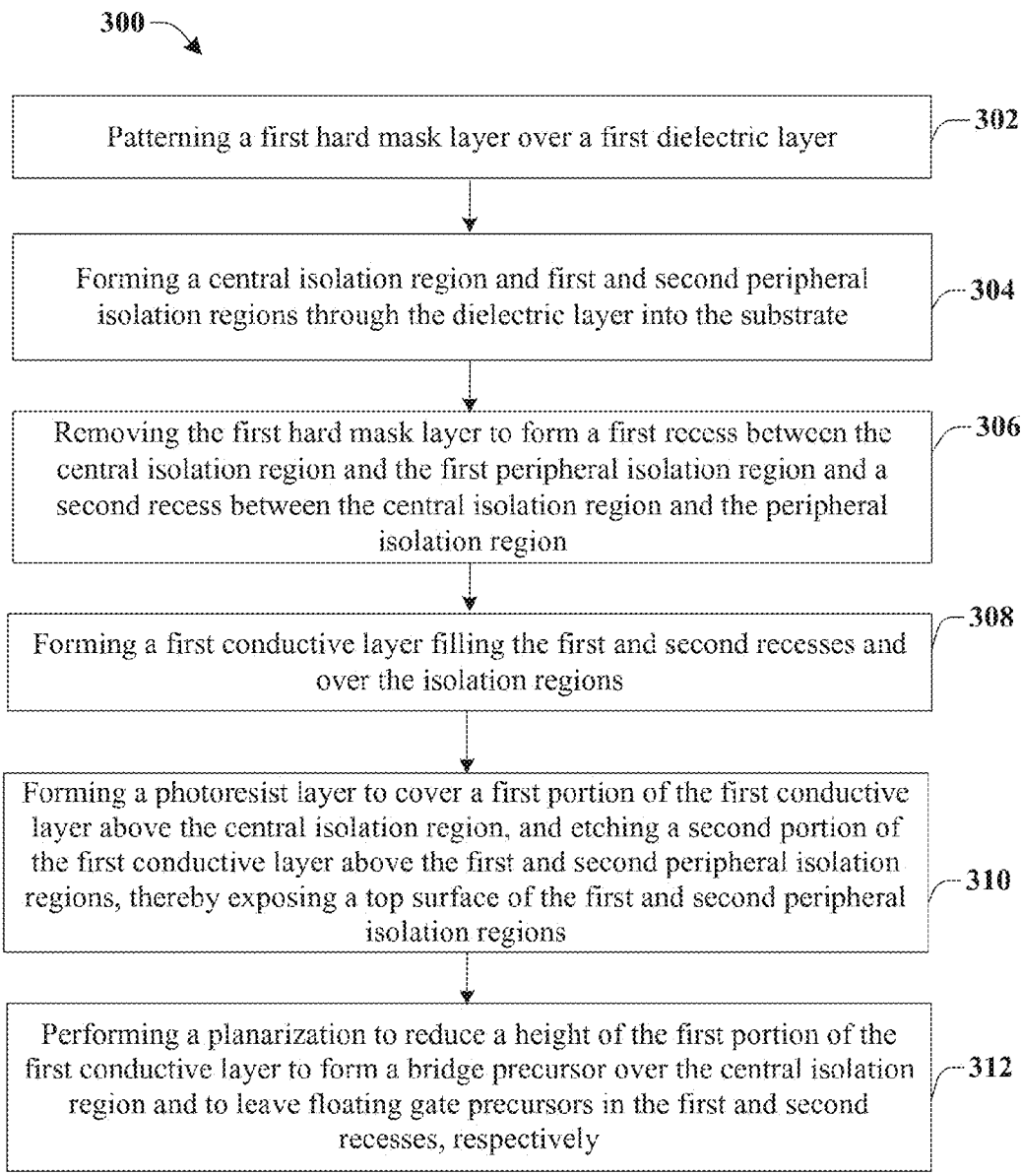
FIG. 3 illustrates a flow diagram of some embodiments of a method of forming a non-volatile memory cell.

FIG. 3 shows a flow diagram of some embodiments of a method 300 of forming a non-volatile memory cell. The method 300 discloses a self-aligned process to form the non-volatile memory cell with two transistors having floating gates connected together by a floating gate bridge. The method 300 includes a slit etch act followed by a planarization act to form the floating gates and the floating gate bridge.

At 302, a first hard mask layer is patterned over a first dielectric layer. The first dielectric layer is acted as a gate dielectric precursor. The patterned first hard mask layer includes a plurality of strips spaced apart from one another.

At 304, a central isolation region and first and second peripheral isolation regions are formed through the dielectric layer into the substrate. The central isolation region is formed between innermost sides the first and second peripheral isolation regions and the central isolation region and the first and second peripheral isolation regions are spaced apart from one another by the first hard mask layer in a first direction. The isolation regions are used to insulate active regions disposed in the substrate under the hard mask layer from one another. The isolation regions are formed between the first hard mask layer strips, separating the strips from one another.

At 306, the first hard mask layer is removed to form a first recess between the central isolation region and the first peripheral isolation region and a second recess between the central isolation region and the peripheral isolation region.

At 308, a first conductive layer is formed to fill the first and second recesses and over the isolation regions.

At 310, a photoresist layer is formed to cover a first portion of the first conductive layer above the central isolation region, and a second portion of the first conductive layer above the first and second peripheral isolation regions is removed, thereby exposing a top surface of the first and second peripheral isolation regions. In some embodiments, removal of the second portion of the first conductive layer is performed by a dry etching process, and act 310 is referred to as a "slit etch".

At 312, performing a planarization to reduce a height of the first portion of the first conductive layer to form a bridge precursor over the central isolation region and to leave the floating gate precursors in the first and second recesses, respectively. Thereby the floating gates are formed self-aligned by the isolation regions. The bridge precursor connects the floating gate precursors in the different recesses.

Figure 4:
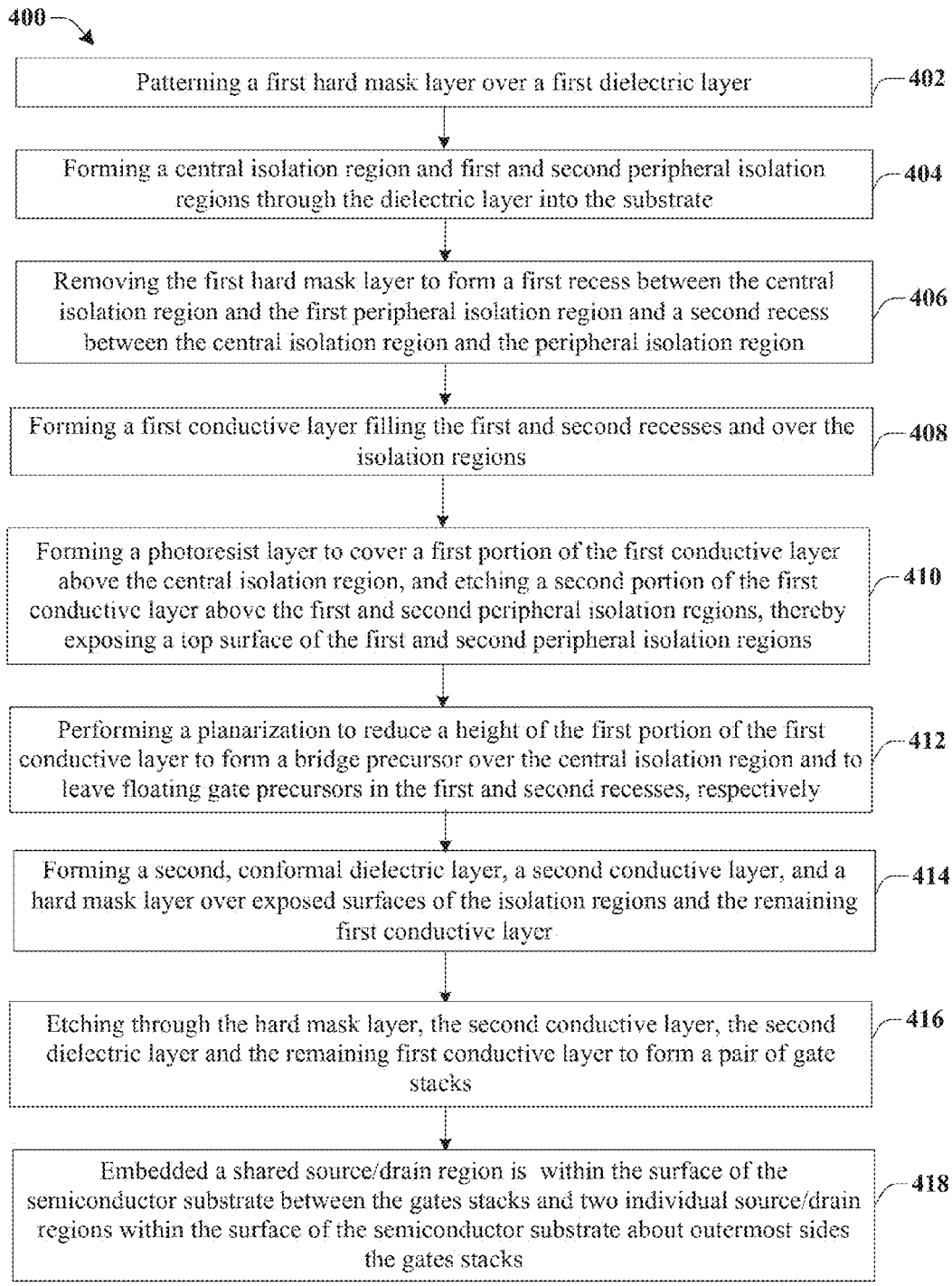
FIG. 4 illustrates a flow diagram of some other embodiments of a method of forming a pair of non-volatile memory cells.

In some embodiments, followed by act 312, two transistor of each of non-volatile memory cells are formed by a series of subsequent acts. FIG. 4 shows a flow diagram of some embodiments of a method 400 of forming a pair of non-volatile memory cell. The method 400 includes a self-aligned process to form a bridge precursor connected two floating gate precursors (similar to the method 300) followed by forming the pair of non-volatile memory cells with gate structures of some embodiments.

While disclosed methods (e.g., methods 300 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, similar to at 302, a first hard mask layer is patterned over a first dielectric layer.

At 404, similar to at 304, a central isolation region and first and second peripheral isolation regions are formed through the dielectric layer into the substrate.

At 406, similar to at 306, the first hard mask layer is removed to form a first recess between the central isolation region and the first peripheral isolation region and a second recess between the central isolation region and the peripheral isolation region.

At 408, similar to at 308, a first conductive layer is formed to fill the first and second recesses and over the isolation regions.

At 410, similar to at 310, a photoresist layer is formed to cover a first portion of the first conductive layer above the central isolation region, and a second portion of the first conductive layer above the first and second peripheral isolation regions is removed, thereby exposing a top surface of the first and second peripheral isolation regions. In some embodiments, removal of the second portion of the first conductive layer is performed by a dry etching process, and act 310 is referred to as a "slit etch".

At 412, similar to at 312, performing a planarization to reduce a height of the first portion of the first conductive layer to form a bridge precursor over the central isolation region and to leave the floating gate precursors in the first and second recesses, respectively.

At 414, a second, conformal dielectric layer, a second conductive layer, and a hard mask layer are stacked over exposed surfaces of the isolation regions and the remaining first conductive layer.

At 416, an etch is performed through the hard mask layer, the second conductive layer, the second dielectric layer and the remaining first conductive layer to form a pair of gate stacks.

At 418, a shared source/drain region is embedded within the surface of the semiconductor substrate between the gates stacks and two individual source/drain regions are embedded within the surface of the semiconductor substrate about outermost sides the gates stacks.

With reference to FIGS. 5-13, cross-sectional views of some embodiments of the semiconductor structure at various stages of manufacture are provided to illustrate some embodiments of forming non-volatile memory cells. Figures with a suffix of "A" correspond to cross-sectional views along an x direction, and figures with a suffix of "B" correspond to cross-sectional views along a y direction that is perpendicular to the x direction. Although FIGS. 5A-13B are described in relation to the method 400, it will be appreciated that the structures disclosed in FIGS. 5A-13B are not limited to the method 400, but instead may stand alone as structures independent of the method 400. Similarly, although the method 400 is described in relation to FIGS. 5A-13B, it will be appreciated that the method 400 is not limited to the structures disclosed in FIGS. 5A-13B, but instead may stand alone independent of the structures disclosed in FIGS. 5A-13B.

Figure 5A:
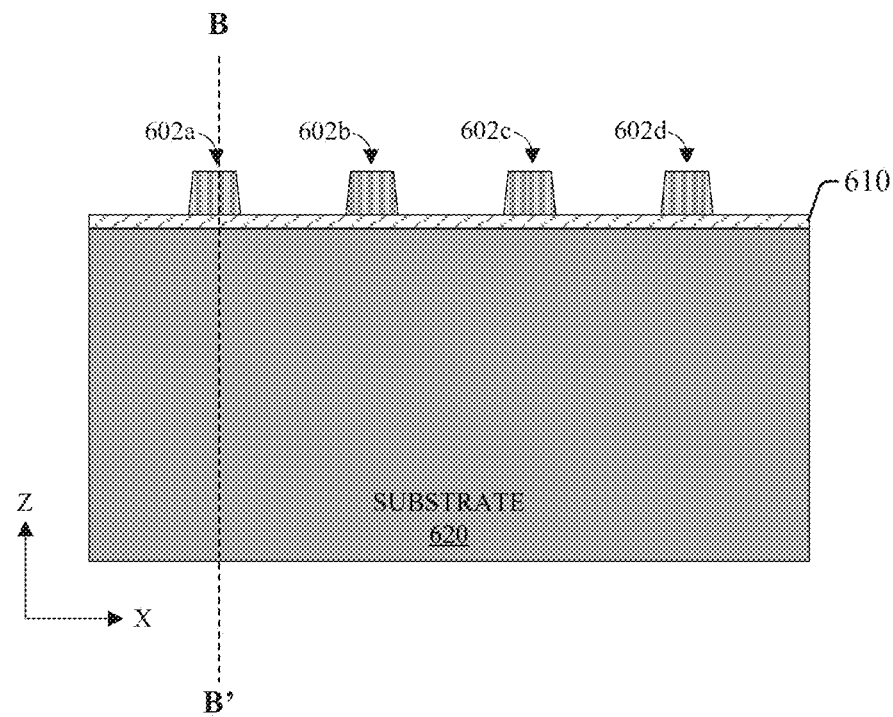
FIGS. 5A-13B illustrate a series of cross-sectional views of some embodiments of forming a non-volatile memory cell at various stages of manufacture.
Figure 5B:
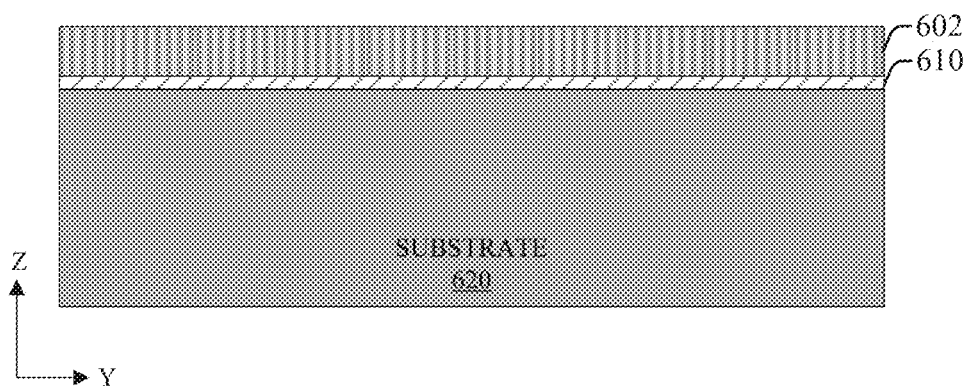

As shown by FIGS. 5A & B, a first dielectric layer 610 is formed over a semiconductor substrate 620. The semiconductor substrate 620 is typically planar with a uniform thickness. Further, the semiconductor substrate 620 is n- or p-type, and can, for example, be a handle wafer, such as a Si wafer or a silicon-on-insulator (SOI) substrate. If present, an SOI substrate is often made up of an active layer of high quality silicon. The first dielectric layer 610 can be an oxide, such as silicon dioxide. A mask layer 602 is formed on the first dielectric layer 610. The mask layer 602 is formed and patterned so it covers diffusion regions (e.g. 602a, 602b, 602c and 602d) of the semiconductor substrate 620. For example, the mask layer 602 can be formed to leave exposed only those regions of the semiconductor substrate 620 to be employed as isolation regions. The mask layer 602 is typically formed of silicon nitride, but other materials are amenable.

Figure 6A:
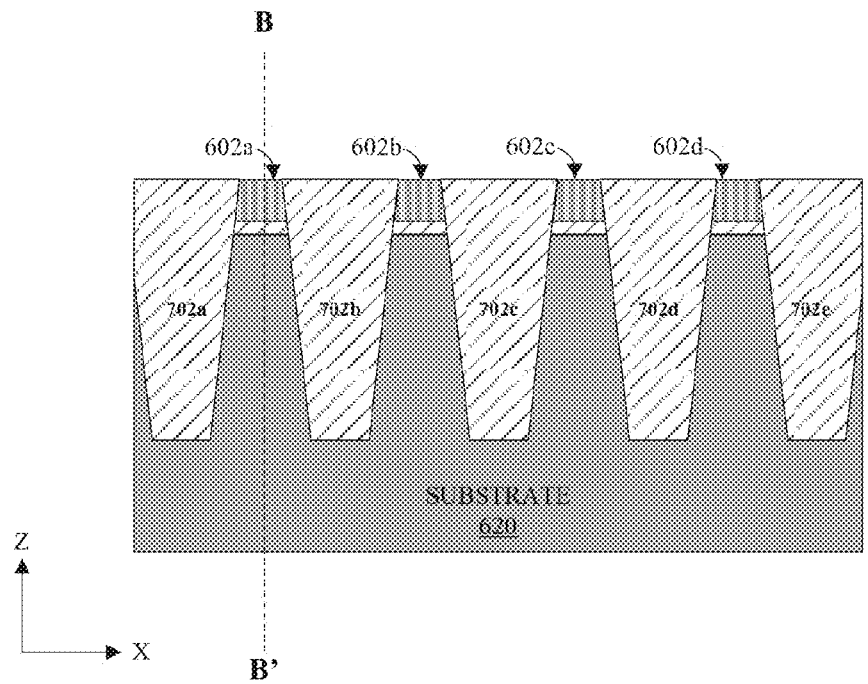
Figure 6B:
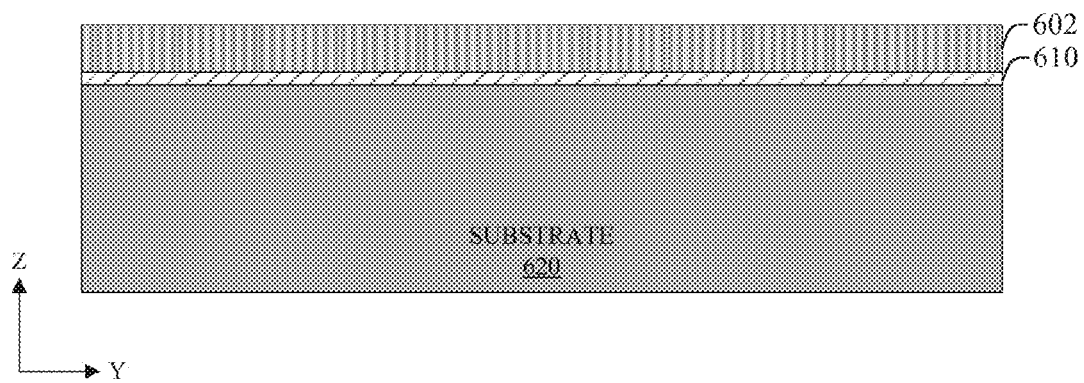

As shown by FIGS. 6A & B, a first etch is performed through the first dielectric layer 610 and partially into the semiconductor substrate 620 in accordance with the mask 602 to create trenches. The trenches are spaced to define diffusion regions therebetween for the non-volatile memory cells. An insulating material is formed to fill the trenches to form isolation regions 702a-e. The insulating material can be formed filling the trenches and covering the mask layer 602 first; then be planarized to exposed the mask layer 602. The insulating material can be an oxide, such as silicon dioxide.

Figure 7A:
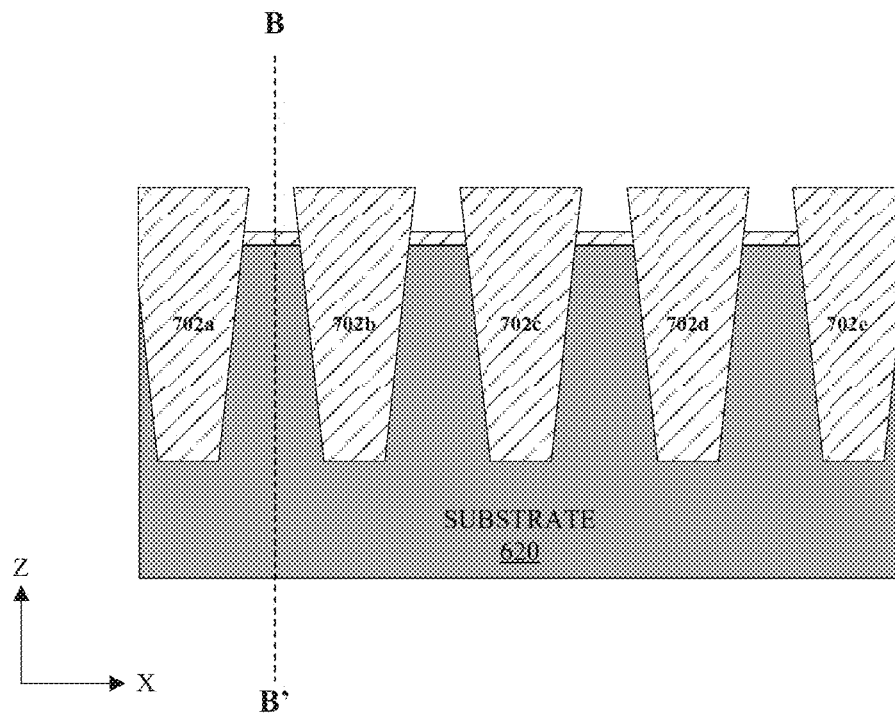
Figure 7B:
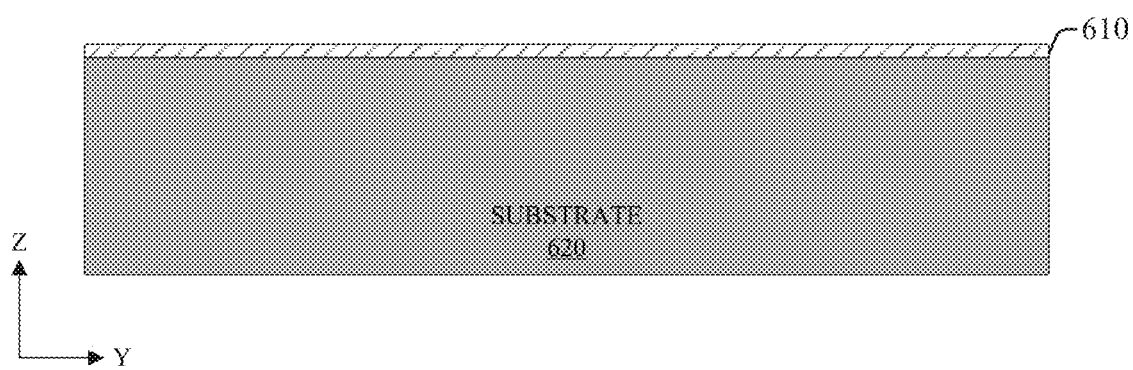

As shown by FIGS. 7A & B, a second etch is performed through the mask layer 602 to remove the mask layer 602 and to create recesses between the isolation regions 702 abutting sidewalls of the isolation regions 702.

Figure 8A:
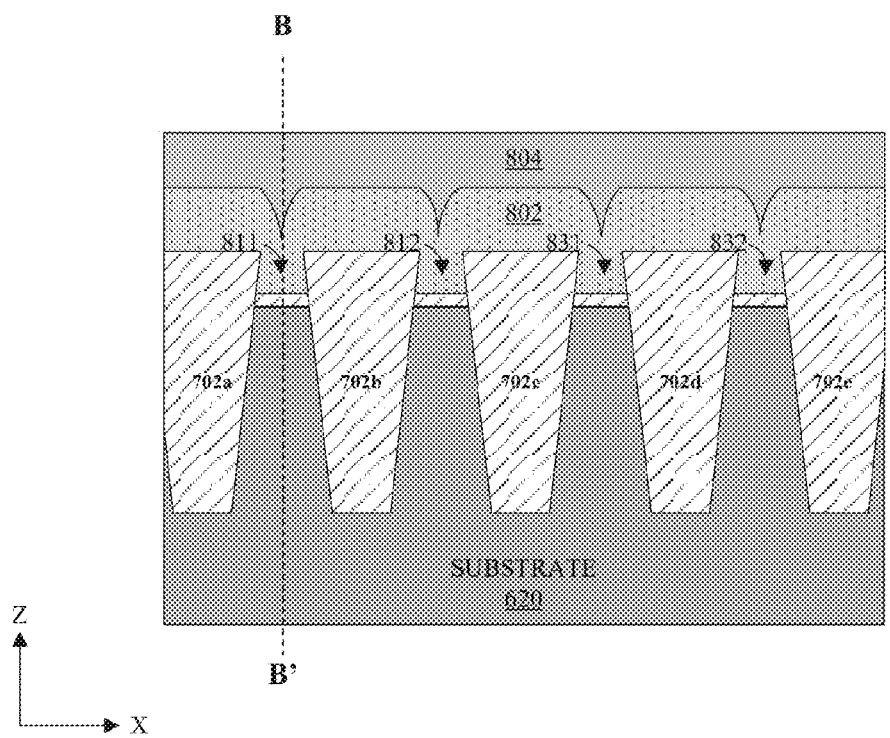
Figure 8B:
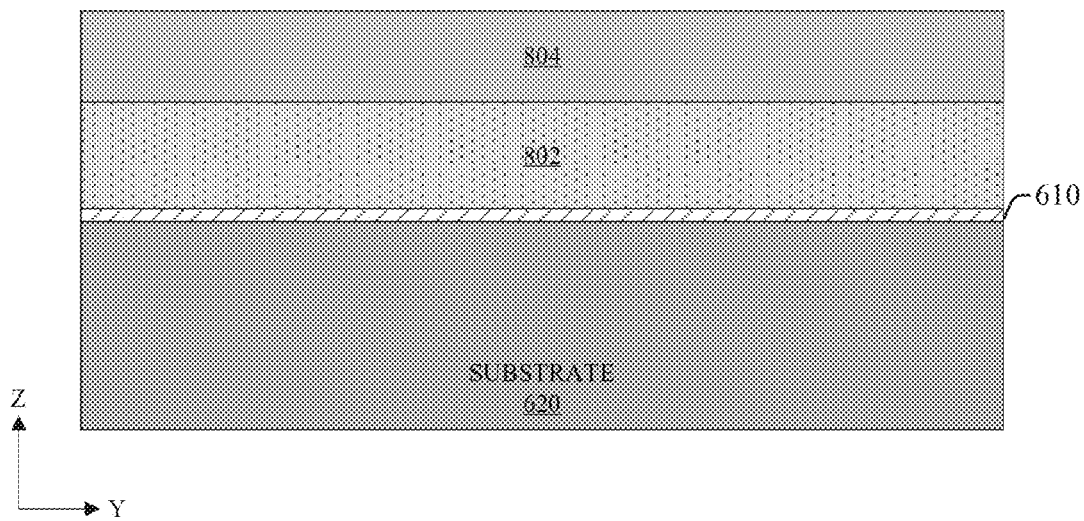

As shown by FIGS. 8A & B, a first conductive layer 802 is formed to fill the recesses and cover the insulating material. The first conductive layer 802 is typically formed of polysilicon and typically has a maximum thickness of from about 450 Å to about 550 Å. A anti-reflective coating (BARC) layer 804 with a thickness of from about 400 Å to about 800 Å can be formed on the first conductive layer 802.

Figure 9A:
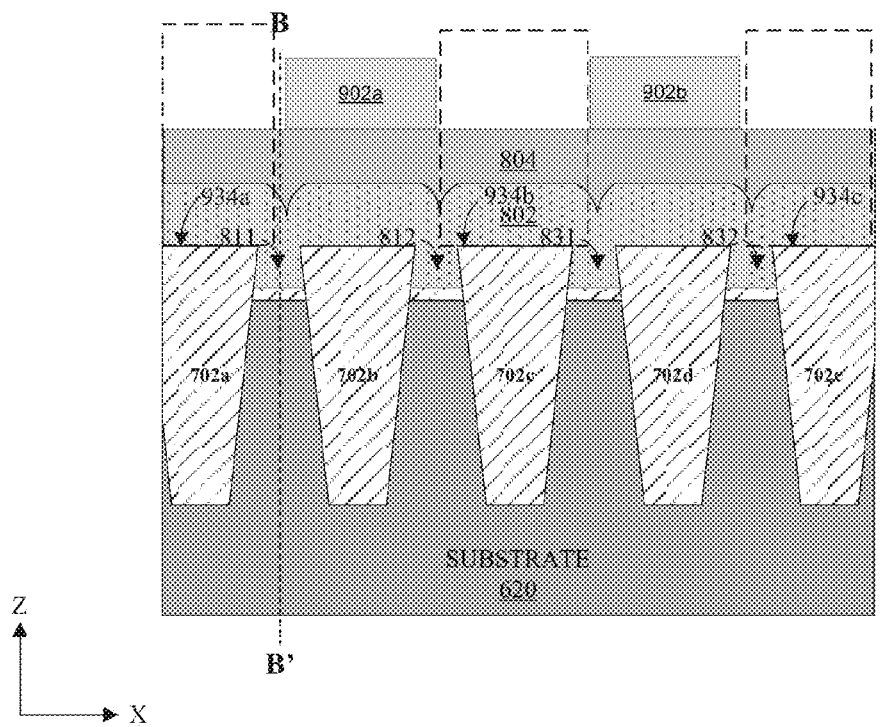
Figure 9B:
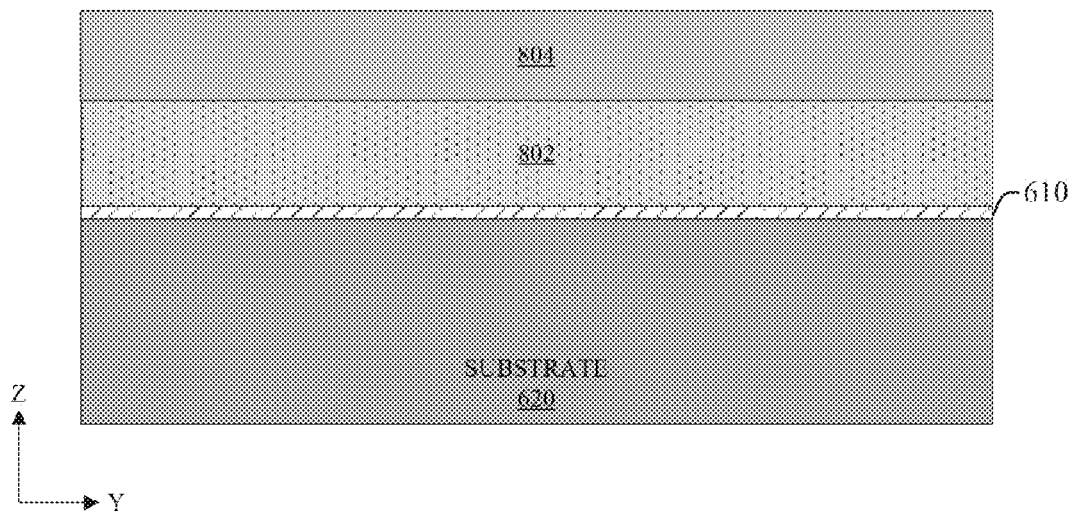

As shown by FIGS. 9A & B, a photoresist layer 902 is formed to cover a first portion of the first conductive layer 802 above a first group of isolation regions, named central isolation regions, including for example 702b and 702d, and a second etch is performed to a second portion of the first conductive layer 802 above the second group of isolation regions, named peripheral isolation regions, including for example, 702a, 702c and 702e; thereby exposing top surfaces 934a, 934b and 934c of the second group of isolation regions 702a, 702c and 702e. In some embodiments, the second etch process may be referred to as a "slit etch".

Figure 10A:
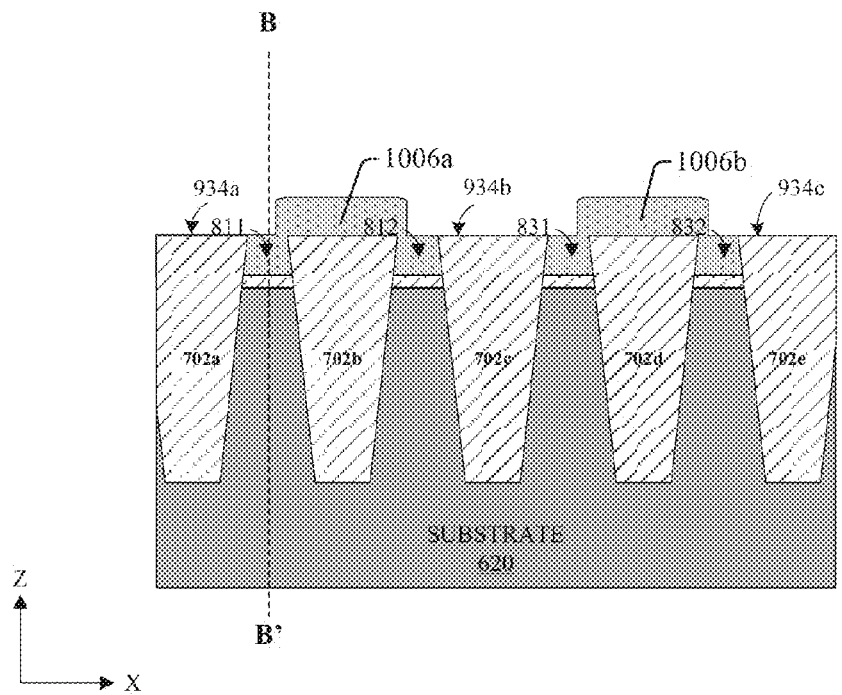
Figure 10B:
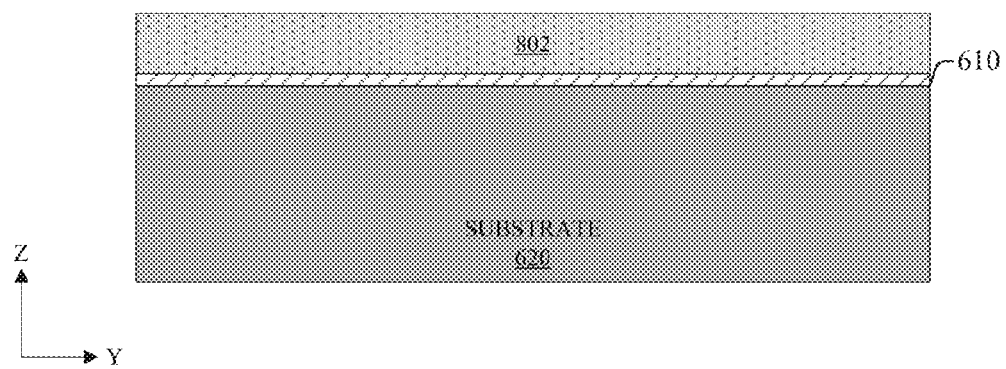

As shown by FIGS. 10A & B, a planarization process, for example, a chemical-mechanical polishing (CMP) process is performed to reduce a height to the first portion of the first conductive layer 802 to form bridge precursors 1006a and 1006b directly above the central isolation regions 702b and 702d, respectively connecting pairs of floating precursors 811-812 and 831-832 disposed in the recesses. Typically, the maximum thickness of the remaining first conductive layer 802' is about 350 Å.

Figure 11A:
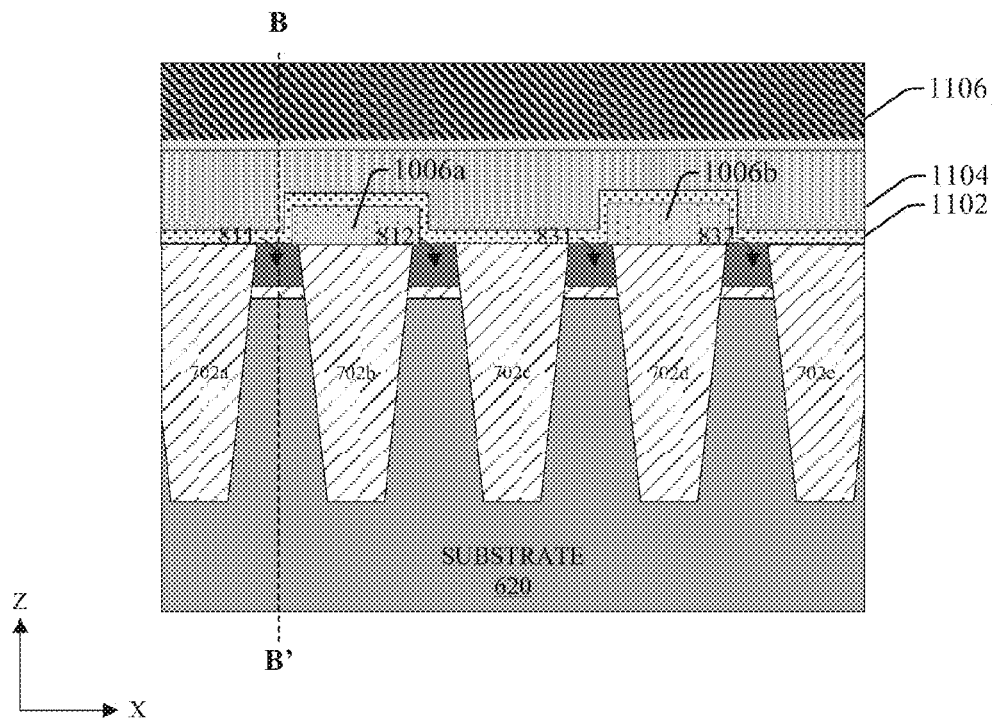
Figure 11B:
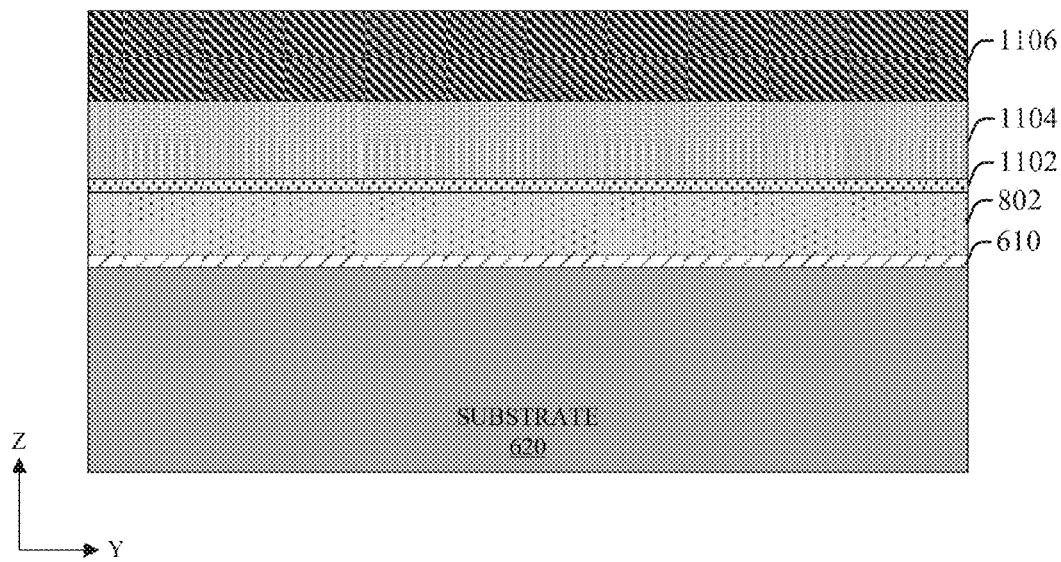

As shown by FIGS. 11A & B, a second, conformal dielectric layer 1102, a second conductive layer 1104, and a hard mask layer 1106 are stacked or formed in that order over the isolation regions 702 and the remaining first conductive layer 802'. The second dielectric layer 1102 is typically an ONO dielectric and conforms to the remaining first conductive layer 802' and the peripheral isolation regions 702b, 702c and 702e, etc. The second conductive layer 1104 is typically polysilicon and typically has a planar top surface. The hard mask layer 1106 is typically a nitride-oxide-nitride (NON) dielectric and typically has a planar top surface.

Figure 12A:
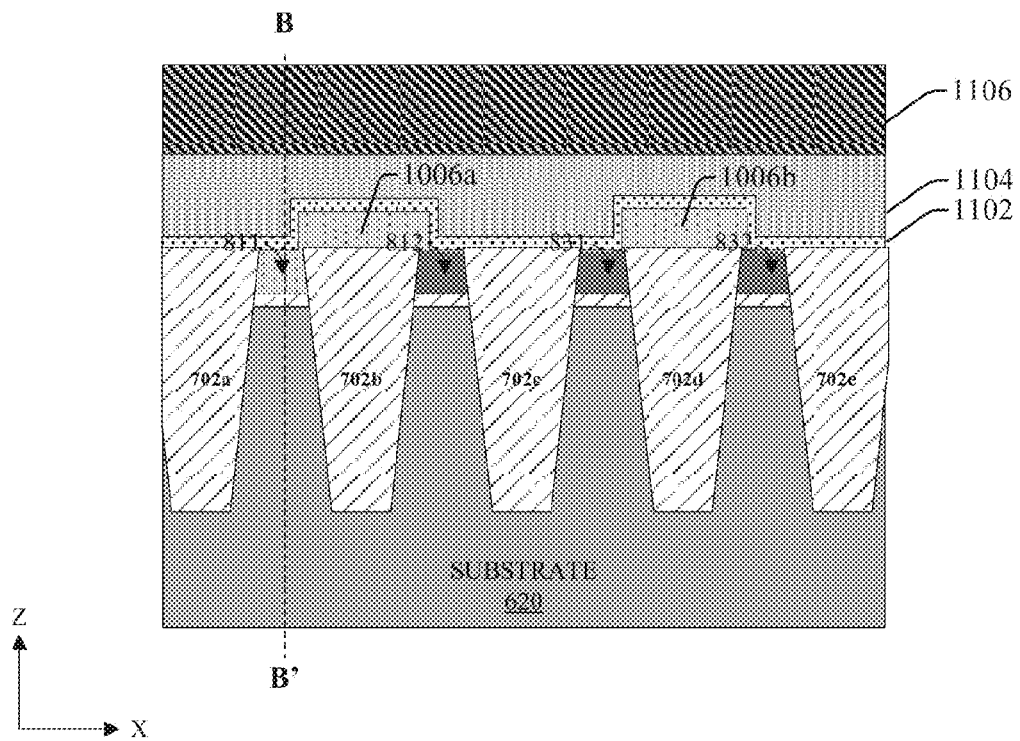
Figure 12B:
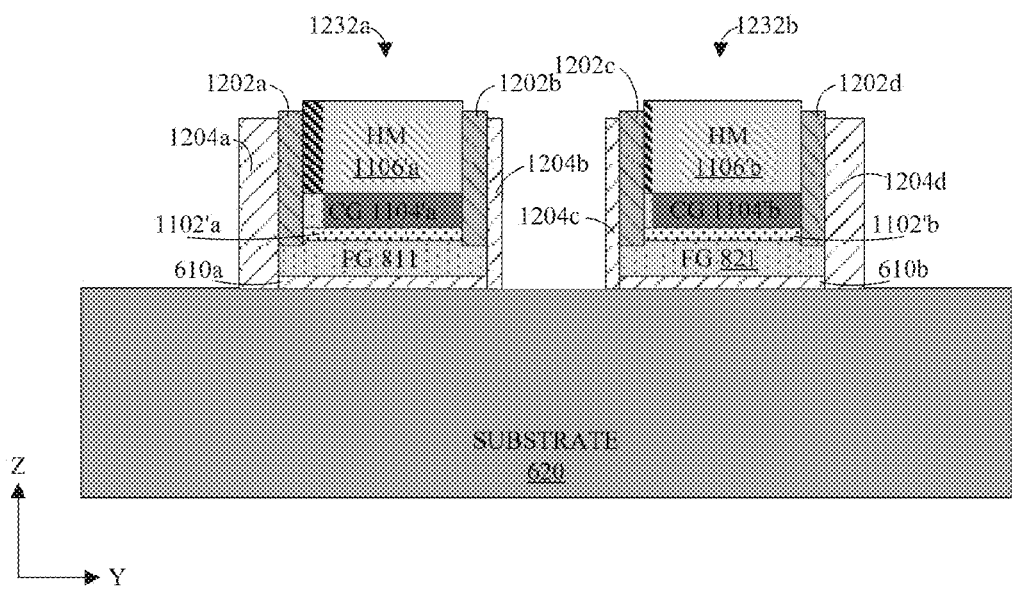

As shown by FIGS. 12A & B, an etch is performed through the hard mask, second conductive, second dielectric and the remaining first conductive layers 1106, 1104, 1102 and 802' to form a pair of gate stacks 1232a and 1232b. The gate stacks 1232 includes a pair of spaced control gates 1104'a, 1104'b and a pair of spaced floating gates 811 and 812 under the control gates 1104'. The formed control gates 1104' are each sandwiched between an inter-gate dielectric regions 1102'a, 1102'b and a hard mask 1106'a, 1106'b, and each rest at the floating gate 811 or 821. The inter-gate dielectric region 1102' electrically isolates the remaining first conductive layer 802' from the control gates 1104, while the hard mask 1106' masks the control gates 1104' during manufacture. In some embodiments, spacers 1202a, 1202b, 1202c and 1202d are formed along sidewalls of each control gate 1104'. The spacers 1202 of the control gates 1104' extend from the floating gates 811 and 821, along the sidewalls of the control gate 1104', to approximately even with a top surface of the hard mask 1106'. In some embodiments, the spacers 1202 are formed by conformally forming an intermediate dielectric layer over sidewalls of the control gates 1106' and the inter-gate dielectric regions 1104', over the hard masks 1106', and over the floating gates 811 and 821. Liners 1204a, 1204b, 1204c and 1204d are formed along opposing sidewalls of each floating gates 811 and 812 and along corresponding sidewalls of the spacers 1202. The liners 1204 of a floating gate 811 or 812 extend from the semiconductor substrate 620, along the sidewalls of the floating gate 811 or 812 and the spacers 1202, to approximately even with a top surface of the hard mask 1106'. In some embodiments, the liners 1204 can be formed by conformally forming an intermediate dielectric layer over sidewalls of the floating gates and the spacers 1202, over the hard masks 1106', and over the semiconductor substrate 620. Typically, the intermediate dielectric layer is an oxide dielectric formed by high temperature oxide (HTO) deposition. An etch is then performed through the intermediate dielectric layer to remove portions of the intermediate dielectric layer that line or are otherwise formed on a horizontal surface of the semiconductor substrate 620 and, in some embodiments, the hard masks 1106'.

Figure 13A:
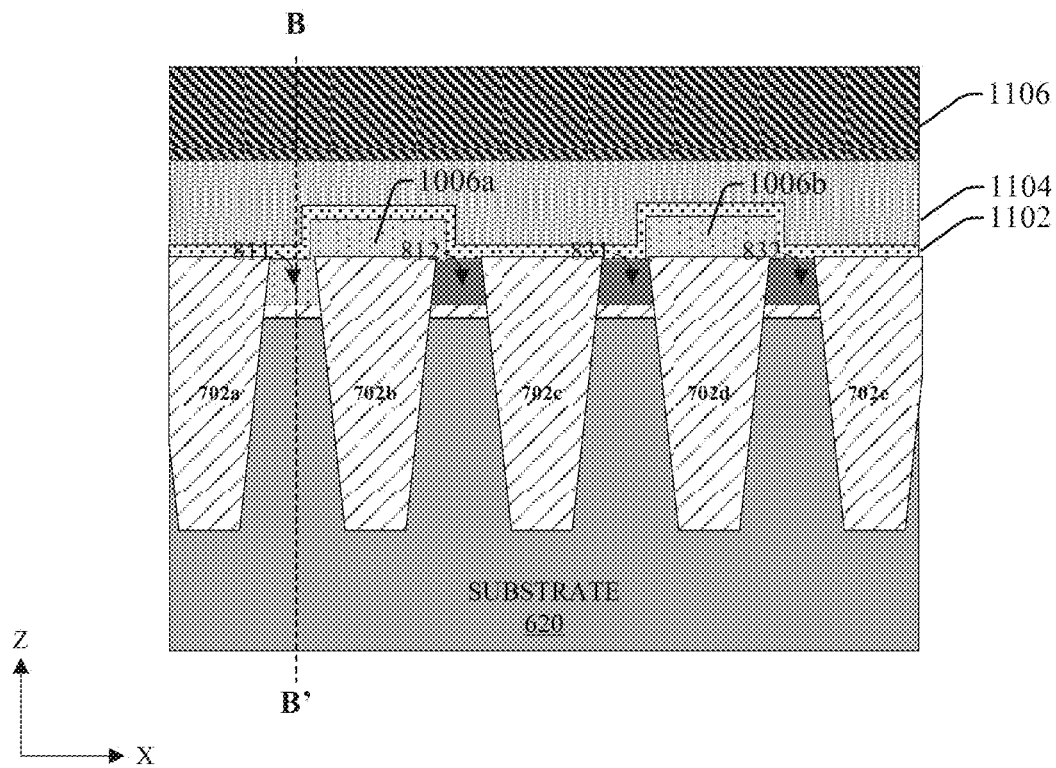
Figure 13B:
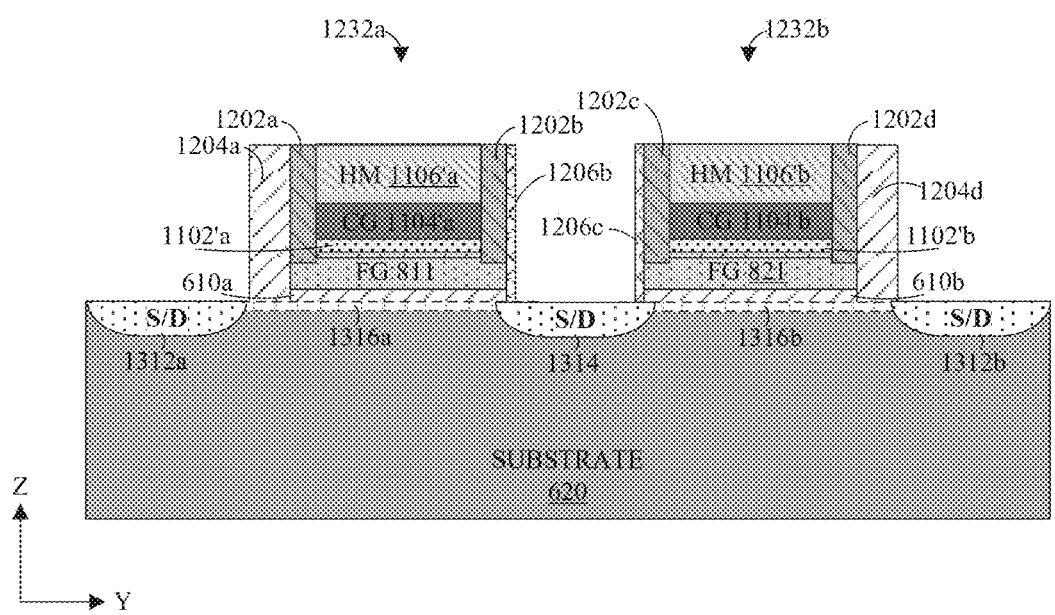

As shown by FIGS. 13A & B, a shared source/drain region 1314 is embedded within the surface of the semiconductor substrate 620 between the gates stacks 1232a and 1232b. In some embodiments, the embedding is performed by masking peripheral regions of the semiconductor structure (i.e., those regions outside a central region between the gate stacks 1232a and 1232b) with a photoresist. Thereafter, the liners 1204*b* and 1204*c* disposed between the gate stacks 1232 are removed, and ions (e.g., n+ ions) are implanted into the semiconductor substrate 620 to form the shared source/drain region 1314 with a predefined thickness, such as 20 A. With the shared source/drain region 1314 embedded, the photoresist is removed. The shared source/drain region 1314 may be of an opposite type as the semiconductor substrate 620 or of an opposite type as a well region or active region in which the non-volatile memory cells are formed. Second lines 1206*b* and 1206*c* are then formed along sidewalls of the gate stacks 1232 to protect the gate stacks 1232.

Still shown by FIGS. 13A & B, two individual source/drain regions 1312*a* and 1312*b* are embedded within the surface of the semiconductor substrate 620 about outermost sides the gates stacks 1232*a* and 1232*b*. In some embodiments, the individual source/drain regions 1312 are embedded by masking a central region between the gates stacks 1232 with a photoresist. Thereafter, ions (e.g., n+ ions) of the same type as the shared source/drain region 1314 are implanted into the semiconductor substrate 620 to form the individual source/drain regions 1312 with a predefined thickness, such as 20 A. The shared and individual source/drain regions 1312*a*, 1312*b* are spaced apart with the shared source/drain region 1314 in the middle of the two individual source/drain regions 1312. Further, each individual source/drain region 1312 and the shared source/drain region 1314 define a channel region 1316*a*, 1316*b* therebetween.

Thus, as can be appreciated from above, the present disclosure provides a non-volatile memory cell that employs a floating gate bridge connecting a first floating gate of a first transistor and a second floating gate of a second transistor.

In some embodiments, the present disclosure provides a non-volatile memory cell disposed over a substrate. The non-volatile memory cell comprises a first active region and a second active region separated by a central isolation region in a first direction. The non-volatile memory cell further comprises first and second peripheral isolation regions disposed about outermost sides of the first and second active regions. The central isolation region and the first and second peripheral isolation regions have a first height above the first and second active regions forming a first recess between the central isolation region and the first peripheral isolation region, and a second recess between the central isolation region and the second peripheral isolation region. The non-volatile memory cell further comprises first and second floating gates disposed in the first and second recesses respectively and a floating gate bridge disposed over the central isolation region electrically connecting the first and second floating gates. The first floating gate is disposed abutting a first sidewall of the first peripheral isolation region and the second floating gate is disposed abutting a second sidewall of the second peripheral isolation region.

In other embodiments, the present disclosure provides a non-volatile memory. The non-volatile memory comprises a plurality of non-volatile memory cells arranged in a plurality of rows and columns in a semiconductor substrate of a first conductivity type. Each memory cell comprises a first transistor and a second transistor. The first transistor comprises a first region and a second region of a second conductivity type spaced apart from one another by a first channel region, defined in a column direction; a first floating gate disposed over the first channel region, insulated from the first channel region by a first dielectric layer; and a first control gate disposed over the first floating gate, insulated from the first floating gate by a second dielectric layer. The second transistor comprises a third region and a fourth region of a second conductivity type spaced apart from one another by a second channel region, defined in a column direction; a second floating gate disposed over the second channel region, insulated from the second channel region by the first dielectric layer; and a second control gate disposed over the second floating gate, insulated from the second floating gate by the second dielectric layer. The second transistor is spaced apart from the first transistor in a row direction substantially perpendicular to the column direction. The first region and the third region are aligned in the row direction and insulated from one another in the substrate by an central isolation region. The first floating gate is disposed abutting a sidewall of a first peripheral isolation region and the second floating gate is disposed abutting a sidewall of a second peripheral isolation region disposed about outermost sides of the first and second transistors in the row direction and electrically connected by a floating gate bridge.

In yet other embodiments, the present disclosure provides a method of forming a non-volatile memory cell over a semiconductor substrate. In the method, a first hard mask layer is patterned over a first dielectric layer. Then a central isolation region and first and second peripheral isolation regions are formed through the dielectric layer into the substrate. The central isolation region is formed between innermost sides the first and second peripheral isolation regions and the central isolation region and the first and second peripheral isolation regions are spaced apart from one another by the first hard mask layer in a first direction. Then the first hard mask layer is removed to form a first recess between the central isolation region and the first peripheral isolation region and a second recess between the central isolation region and the peripheral isolation region. Then a first conductive layer if formed filling the first and second recesses and over the isolation regions. Then a photoresist layer is formed to cover a first portion of the first conductive layer above the central isolation region, and a second portion of the first conductive layer above the first and second peripheral isolation regions is etched, thereby exposing a top surface of the first and second peripheral isolation regions. Then a planarization is performed to reduce a height of the first portion of the first conductive layer to form a bridge precursor over the central isolation region and to leave floating gate precursors in the first and second recesses, respectively. The bridge precursor connects the floating gate precursors in the different recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory cell disposed over a substrate, comprising:
   a first active region and a second active region separated by a central isolation region in a first direction;
   first and second peripheral isolation regions disposed about outermost sides of the first and second active regions; the central isolation region and the first and second peripheral isolation regions having a first height above the first and second active regions forming a first recess between the central isolation region and the first peripheral isolation region, and a second recess between the central isolation region and the second peripheral isolation region;

first and second floating gates disposed in the first and second recesses respectively; and a floating gate bridge disposed over the central isolation region electrically connecting the first and second floating gates;

wherein the first floating gate is disposed abutting a first sidewall of the first peripheral isolation region and the second floating gate is disposed abutting a second sidewall of the second peripheral isolation region.

2. The non-volatile memory cell of claim 1, wherein the floating gate bridge has a second height above the connected first and second floating gates; and the floating gate bridge laterally extends over an edge of the central isolation region along the first direction.

3. The non-volatile memory cell of claim 1, wherein the first height is in a range of from about 100 Å to about 1000 Å.

4. The non-volatile memory cell of claim 1, wherein the isolation regions are shallow trenches filled with an insulating material.

5. The non-volatile memory cell of claim 1, wherein the first and second floating gates and the floating gate bridge comprise a polysilicon layer with a thickness of around 350 angstrom (Å).

6. The non-volatile memory cell of claim 1, further comprising a first transistor disposed at the first active region and a second transistor disposed at the second active region, each of the first and second transistors comprising:

a source region and a drain region spaced apart by a channel region in a second direction substantially perpendicular to the first direction; wherein the first or second floating gate corresponding to the first or second transistor is disposed over at least a portion of the corresponding channel region, insulated from the channel region by a gate dielectric; and a control gate capacitively coupled to the corresponding first or second floating gate.

7. The non-volatile memory cell of claim 6, wherein the non-volatile memory cell is read from the first transistor; and programmed and erased from the second transistor.

8. The non-volatile memory cell of claim 6, wherein the source regions of the first and second transistors are electrically connected in the substrate.

9. The non-volatile memory cell of claim 6, wherein the non-volatile memory cell is read by applying a first voltage to the drain region of the first transistor; and programmed by applying a first current to the source region of the second transistor.

10. The non-volatile memory cell of claim 6, wherein the first and second floating gates of the first and second transistors are insulated from the corresponding control gates, respectively, by an oxide-nitride-oxide (ONO) dielectric layer.

11. A non-volatile memory, comprising:

a plurality of non-volatile memory cells arranged in a plurality of rows and columns in a semiconductor substrate of a first conductivity type, with each memory cell comprising:

a first transistor, comprising: a first region and a second region of a second conductivity type spaced apart from one another by a first channel region, defined in a column direction; a first floating gate disposed over the first channel region, insulated from the first channel region by a first dielectric layer; and a first control gate disposed over the first floating gate, insulated from the first floating gate by a second dielectric layer; and a second transistor, comprising: a third region and a fourth region of a second conductivity type spaced apart from one another by a second channel region, defined in the column direction; a second floating gate disposed over the second channel region, insulated from the second channel region by the first dielectric layer; and a second control gate disposed over the second floating gate, insulated from the second floating gate by the second dielectric layer;

wherein the second transistor is spaced apart from the first transistor in a row direction substantially perpendicular to the column direction;

wherein the first region and the third region are aligned in the row direction and insulated from one another in the substrate by an central isolation region;

wherein the first floating gate is disposed abutting a sidewall of a first peripheral isolation region and the second floating gate is disposed abutting a sidewall of a second peripheral isolation region disposed about outermost sides of the first and second transistors in the row direction and electrically connected by a floating gate bridge.

12. The non-volatile memory of claim 11, further comprising:

a plurality of word lines extending in the row direction, wherein each word line electrically connects the control gates of memory cells in a same row;

a plurality of bit lines extending in the column direction, wherein each bit line electrically connects the first region of memory cells in a same column;

a plurality of program lines extending in the column direction, wherein each program line electrically connects the third region of memory cells in the same column; and a source line electrically connecting the second and fourth regions of the plurality of non-volatile memory cells.

13. The non-volatile memory of claim 11, wherein memory cells in a same column are connected in series and are read from the first region of one same memory cell of the column.

14. The non-volatile memory of claim 11, wherein the first and second floating gates are disposed abutting the central isolation region and the floating gate bridge is disposed rising a step from the first floating gate or the second floating gates.

15. A non-volatile memory cell, comprising:

a first active region and a second active region disposed beneath an upper surface of a substrate, and separated one another in a first direction by a central isolation region;

a first floating gate and a second floating gate respectively disposed directly above the first and second active regions, and separated from the substrate by a gate dielectric layer; and a floating gate bridge disposed directly on the central isolation region, and electrically connecting the first and second floating gates;

a first source region and a first drain region within the first active region on opposite sides of the first floating gate in a second direction substantially perpendicular to the first direction; and a second source region and a second drain region within the second active region on opposite sides of the second floating gate in the second direction.

16. The non-volatile memory cell of claim 15, wherein the first drain region and the second drain region are separated by the central isolation region.

17. The non-volatile memory cell of claim 15, wherein the first source region and the second source region are continuously connected.

18. The non-volatile memory cell of claim 15, wherein the floating gate bridge is continuous from the first and second floating gates and has an upper surface that is higher than that of the first and second floating gates.

19. The non-volatile memory cell of claim 15, further comprising:
- first and second peripheral isolation regions disposed about outermost sides of the first and second active regions, the central isolation region and the first and second peripheral isolation regions having a first height above the first and second active regions that is substantially same with that of the first and second floating gates;
- wherein the first floating gate is disposed abutting a first sidewall of the first peripheral isolation region and the second floating gate is disposed abutting a second sidewall of the second peripheral isolation region.

20. The non-volatile memory cell of claim 15, further comprising:
- a control gate capacitively coupled to the first and second floating gates.

* * * * *